United States Patent [19]
Huguenin et al.

[11] 4,445,256
[45] May 1, 1984

[54] METHOD OF MANUFACTURING PIEZOELECTRIC RESONATOR COMPONENTS

[75] Inventors: Raymond Huguenin, Preles; Gottfried Kuechli, Bienne, both of Switzerland

[73] Assignee: Dryan-Fordahl Technologies S.A., Bienne, Switzerland

[21] Appl. No.: 345,283

[22] Filed: Feb. 3, 1982

Related U.S. Application Data

[62] Division of Ser. No. 164,378, Jun. 30, 1980, abandoned.

[30] Foreign Application Priority Data

Jul. 5, 1979 [CH] Switzerland ............... 6283/79

[51] Int. Cl.³ ............................................. H01L 41/22
[52] U.S. Cl. ............................... 29/25.35; 174/50.54; 174/52 S; 310/340; 310/348
[58] Field of Search ............... 29/25.35; 310/320, 340, 310/344, 348; 174/52 S, 50.54

[56] References Cited

U.S. PATENT DOCUMENTS

| | | | |
|---|---|---|---|
| 3,634,787 | 1/1972 | Newell | 333/72 |
| 3,766,616 | 10/1973 | Standte | 29/25.35 |
| 4,012,648 | 3/1977 | Engdahl | 29/25.35 X |
| 4,219,754 | 8/1980 | Hoshi et al. | 310/315 |

FOREIGN PATENT DOCUMENTS

| | | |
|---|---|---|
| 55-49012 | 4/1980 | Japan . |
| 55-49013 | 4/1980 | Japan . |
| 1449797 | 9/1976 | United Kingdom . |
| 2002955 | 7/1978 | United Kingdom . |
| 2029092 | 7/1979 | United Kingdom . |
| 2040560 | 11/1979 | United Kingdom . |
| 2040561 | 11/1979 | United Kingdom . |
| 1568985 | 6/1980 | United Kingdom . |

*Primary Examiner*—Carl E. Hall
*Attorney, Agent, or Firm*—Griffin, Branigan & Butler

[57] ABSTRACT

An electronic component comprising at least one piezoelectric resonator and a process for mass production thereof include the superpositioning of n (n≧1) layers having one or several cut outs defining m (m≧1) resonating elements. Such layers are separated by n−1 intermediate layers in which are provided openings forming frames for the resonating elements. Two terminal layers providing covers in which are arranged blind cavities corresponding to the frames cover the assembly. The resonating elements are provided with electrodes and the layers are fixed to one another by welding together of metallization layers. The component may be used as an individual resonator or as a multiple channel filter.

5 Claims, 15 Drawing Figures

Section V-V

Section W-W

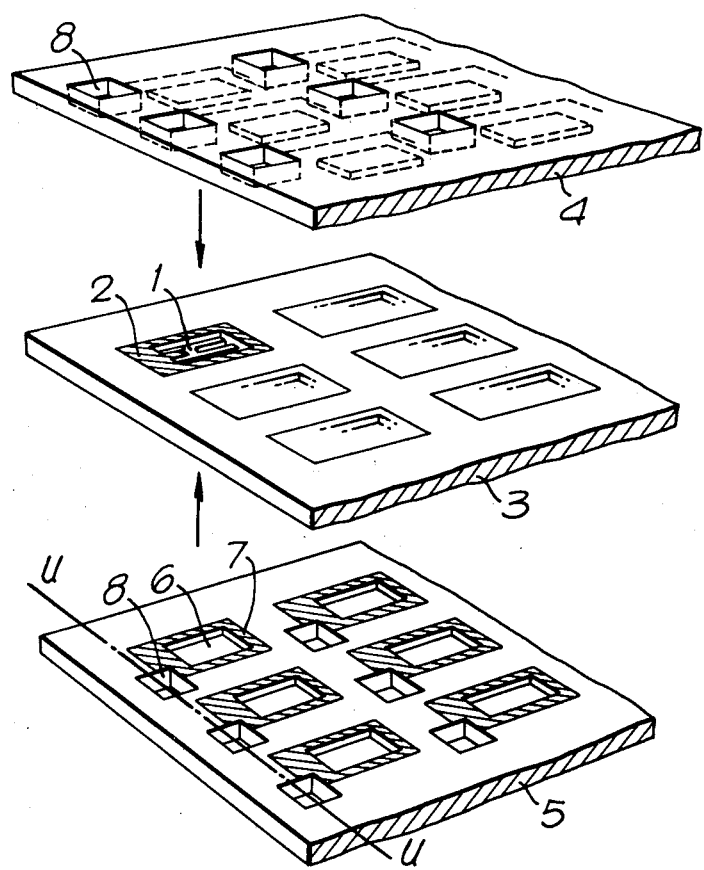
Fig. 4.
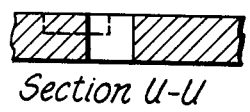
Section U-U

Fig.5.
Fig.6.
Fig.14.
Fig.15.
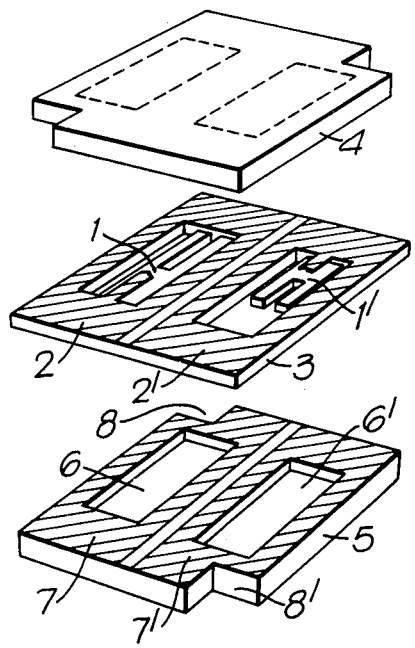
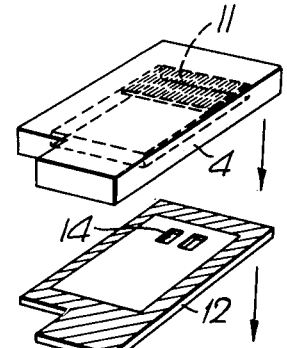
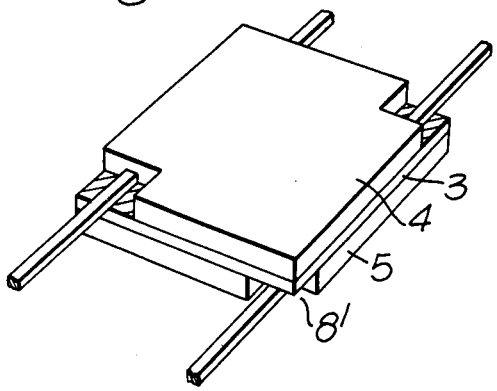
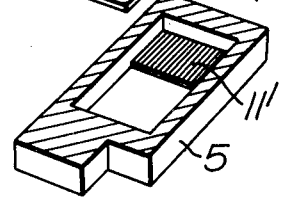
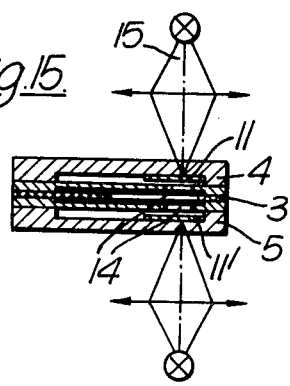

Section u-u

Section v-v

Section w-w

METHOD OF MANUFACTURING PIEZOELECTRIC RESONATOR COMPONENTS

This is a division of application Ser. No. 164,378, filed June 30, 1980, now abandoned.

BACKGROUND OF THE INVENTION

The invention concerns piezoelectric resonators and generally electronic components comprising at least one such resonator.

The search for further improved manufacturing methods in order to permit mass production and resulting lowering of costs thereof has led to the conception of quartz resonators referred to as monolithic, that is to say such as described for instance in French patent applications FR No. 78 33349 and FR No. 78 33350, wherein the resonating element and its support are formed of and from a single piece of material. In such resonators the resonating element is cut out from a piezoelectric layer without being been detached therefrom: in the region of the non active zones the resonating element remains attached to the layer which thus forms a frame support. The resonant element is thereafter provided with electrodes by metal deposits, and in the same manner its frame receives metallized tracks intended for electrical connection of the electrodes with the exterior as well as final assembly by welding of covers on each of the faces of the frame, this resulting in a high quality package.

This technique has led to the possibility of mass production of resonant elements associated with supports having an excellent mechanical resistance. However such individual elements must thereafter be separated from one another in order to realise the packaging and thus the methods of mass production must then be replaced by individual treatment. Moreover it is to be noted that mass production processes have not, up to the present time, been applied except for simple units and never for more complex components which might for instance comprise several resonators and eventually further electronic components which might possibly be integrated therewith.

These limitations, and notably the fact that individual handling of the resonators for the operations of assembly and termination do not appear rational and are a source of time loss have led to efforts for developing new components utilising monolithic resonators to which may be applied manufacturing processes permitting mass production, even for the more complex components comprising several resonators and eventually further elements which may be integrated on the same layer from which the resonators are obtained, thus permitting the realisation of hybride circuits.

SUMMARY OF THE INVENTION

The invention comprises an electronic component and method of manufacture thereof comprising m piezoelectric resonators (where m is an integer $\geq 1$) being formed by the superpositioning of n layers of piezoelectric material (where n is an integer and $m \geq n \geq 1$), each layer having at least one open cut out portion so as to define a zone which constitutes a resonant element and a zone which forms a frame support to which the resonant element remains attached, $n-1$ intermediate layers of insulating material separating said layers of piezoelectric material from one another and in each of which is formed at least one opening forming frame of the same dimensions as corresponding frame supports in contiguous piezoelectric layers, two terminal layers of insulating material forming cover members in the thickness of each of which is arranged at least one blind cavity forming a frame of the same dimensions as corresponding frame supports in the contiguous piezoelectric layers, the resonant elements bearing electrodes connected to metallized tracks applied to their respective frame supports to effect electrical connections, the surface of each frame being coated with metal or metallic alloy and the several layers being fixed to one another by a weld formed by the alloy.

BRIEF DESCRIPTION OF THE DRAWINGS

FIG. 4 illustrates a process for mass production of a component such as that of FIG. 3, FIGS. 5 and 6 represent an exploded view of the finished product of a component according to the invention comprising two resonators, FIG. 11 is an exploded view of a component as obtained from the process of FIG. 10 while FIGS. 14 and 15 illustrate, in the framework of the invention, a component which enables final frequency ajustment through the addition of material.

DETAILED DESCRIPTION OF THE INVENTION

Figure 1:
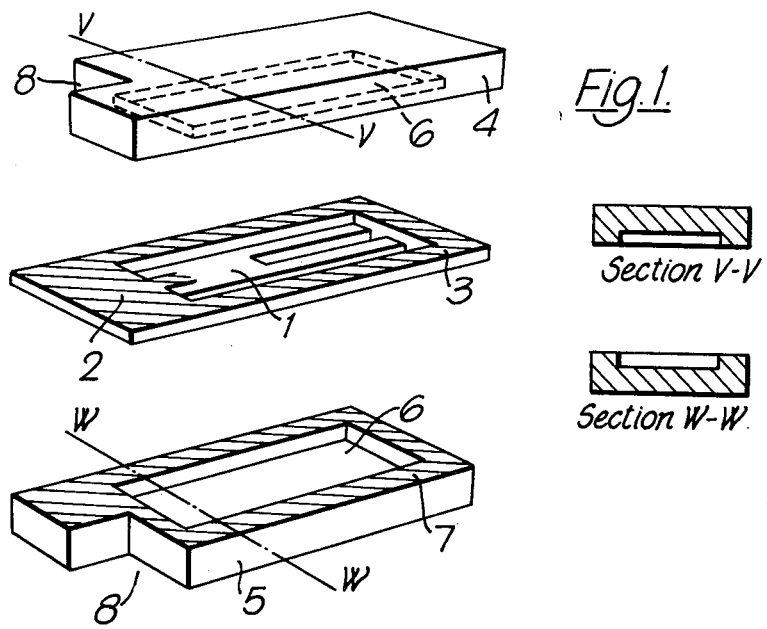
FIG. 1 is an exploded perspective view of a component comprising a tuning fork type resonator in accordance with the invention, before assembly.

A first example, especially simple, of the component in accordance with the invention and comprising only a single resonator is shown in FIG. 1. Resonant element 1 shown here as a tuning fork, but in any case capable of taking any other planar form for example a bar, and of utilising any vibration mode compatible with such planar form, is obtained from a single piece of material along with its support 2 by blanking from a layer 3 of piezoelectric material, for instance monocrystalline quartz for which the cut, defined relative to a privileged direction, has been chosen in accordance with the desired application. Layer 3 thus forms around the resonant element 1 a frame support 2. The resonant element 1 bears the usual electrodes (not shown) obtained by metallization according to any appropriate known technique. The frame support 2 receives on each of the surfaces a metallized track to which is connected the corresponding electrode, and a layer of metallic alloy having a low melting point which will serve for the final assembly.

The resonator is completed by two cover members above and below. In accordance with the invention these are formed by two layers of electrically insulating material having the same dimensions as layer 3 and shown respectively as 4 and 5. Preferably the insulating material will be optically transparent, permitting thus the transmission of a laser beam or heat ray. Glass is well adapted to this utilisation but in view of thermal expansion a crystalline quartz having the same cut as layer 3 appears to have greater advantages. In order to provide clearance for the resonant element 1, blind cavities 6 are arranged in the terminal layers 4 and 5 having the same contour as the frame support 2 for the resonant element. A metallic film of alloy as in the case of frame support 2 is deposited around the cavities in a manner so as to form an analagous frame 7. In order to leave clear a portion of the metallized surface of each of the faces of layer 3, a notch 8 is provided in each of layers 4 and 5, preferably on opposite edges relative to the median axis of the finished component.

Assembly of the component is effected thereafter under vacuum or a partial vacuum in the presence of a noble or inert gas by bringing together the three layers formed by individual parts 3, 4 and 5 aligned in a manner such that the frame are facing one another. The layers in contact are heated above the melting temperature of the metallic alloy and then cooled until solidification of the alloy. Preferably however this operation is effected in two stages. In the first stage a single terminal layer or cover 4 or 5 is fixed to the support layer 3 of the resonant element 1. Then by utilising the contact area left free by notch 8 and the metallic track on the still open face of layer 3, the resonant element may be excited and maintained in oscillation by electrical means, thus permitting the adjustment of the frequency by removal of material from the open face for example through use of a laser beam. This operation terminated, one proceeds in the same manner as previously described for the fixation of the second terminal layer 5. The final frequency adjustment and the usual tests may then be effected through utilisation of the contact areas which the notches 8 leave free. To the assembled product as shown in perspective in FIG. 2 are then fixed electrical conductors 9 thereby to result in the finished component as shown in FIG. 3.

In order to explain the conception of the resonator which has just been described the layer forming the support for the resonant element 1 or the terminal layers 4 and 5 have been considered as having already been cut to the final dimension and prepared before their assembly. Such conception even in the case of a multilayer structure is particularly adapted to mass or series rather than piece by piece. Such mass production of the resonator previously described is illustrated by FIG. 4 wherein the individual elements bear the same reference number as in the preceding.

On layer 3 of piezoelectric material are blanked resonant elements 1 as previously but in series, the electrodes are deposited with the desired connections with the metallic tracks forming a frame support 2 and this on both faces of layer 3. In the terminal layers 4 and 5 on their single internal face are arranged blind cavities 6 with position and dimensions corresponding to frame support 2 of layer 3. A metallized track forms a frame 7 of the metallic alloy having a low melting point around cavity 6. Perforations 8 are thereafter provided in the edge of each frame 7 of the terminal layers 4 and 5. Such perforations are intended to give access to the metallized tracks associated with the resonant elements 1 of layer 3. The perforations 8 at each terminal layer 4 and 5 are preferably arranged in a manner so as not to be face to face with those of the other layer just as in the case of the notches 8 mentioned above.

Figure 2:
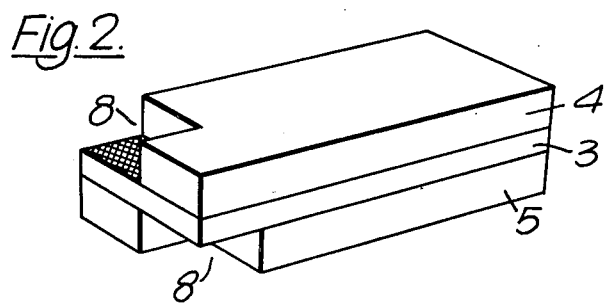
FIG. 2 shows the same component following assembly and, FIG. 3 shows the finished component following fixing of the connecting wires.
Figure 3:
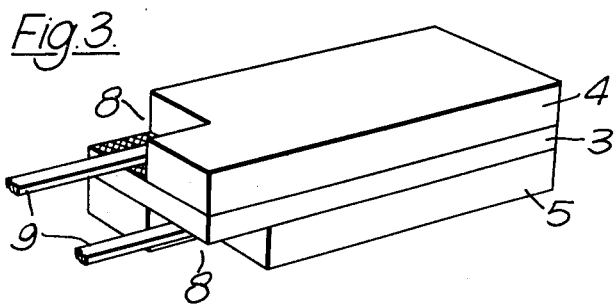

This being accomplished, assembly of the layers 3, 4 and 5 carrying in their turn the individual elements is effected in the same manner as in the case of the resonator of FIGS. 1 to 3. It is only after the final frequency ajustment through utilisation of the areas of layer 3 left free by the perforations 8 for electrical supply that the individual resonators are separated from one another by sawing through the assembled layers, thereby to give components identical to those of FIG. 2. One may thereafter proceed to an individual piece-by-piece treatment in order to obtain finished products with the connected wires 9 such as that shown in FIG. 3.

In what has preceded the final product is a simple resonator but the same multilayer technology may be equally well be applied to the realisation of electronic components comprising two associated resonators having the same frequency, or several (m) resonators of different frequencies for utilisation as multichannel filters, or again of components comprising at least one resonator associated with other discrete electronic components within the same packaging. Examples of such individual realisations which can be obtained by the process of mass production described above are illustrated in FIGS. 5, 6, 7, 8, and 9.

For these general examples with several resonators or individual components within the same component assembly, what has previously been said for the elementary case is applicable by analogy, thus it seems unnecessary and useless to recite every detail.

In FIG. 5 the resonant element 1 with its frame support 2 is associated within the same product, thus on the same layer 3, with a second resonant element 1' with its frame support 2'. The two frames supports 2 and 2' are separated by a non-metallized, thus insulating zone. In the corresponding terminal layers 4 and 5 the cavities 6 are doubled as shown at 6' at well as their frames 7, 7' and separated by an insolating track. The same goes for the notches 8, 8' freeing the metallized areas of the frame supports 2, 2' on the layer 3.

Assembly is carried out as in the preceding instance to obtain the finished product shown in FIG. 6. It is obvious that the mass production method described for the simple resonators may be applied to the present case without any fundamental modification. Such application is particularly interesting for components comprising two resonators having the same frequency but with different dimensional relationships, thereby providing staggered inversion temperatures, such staggering being employed in cases where thermal compensation is desired.

Figure 7:
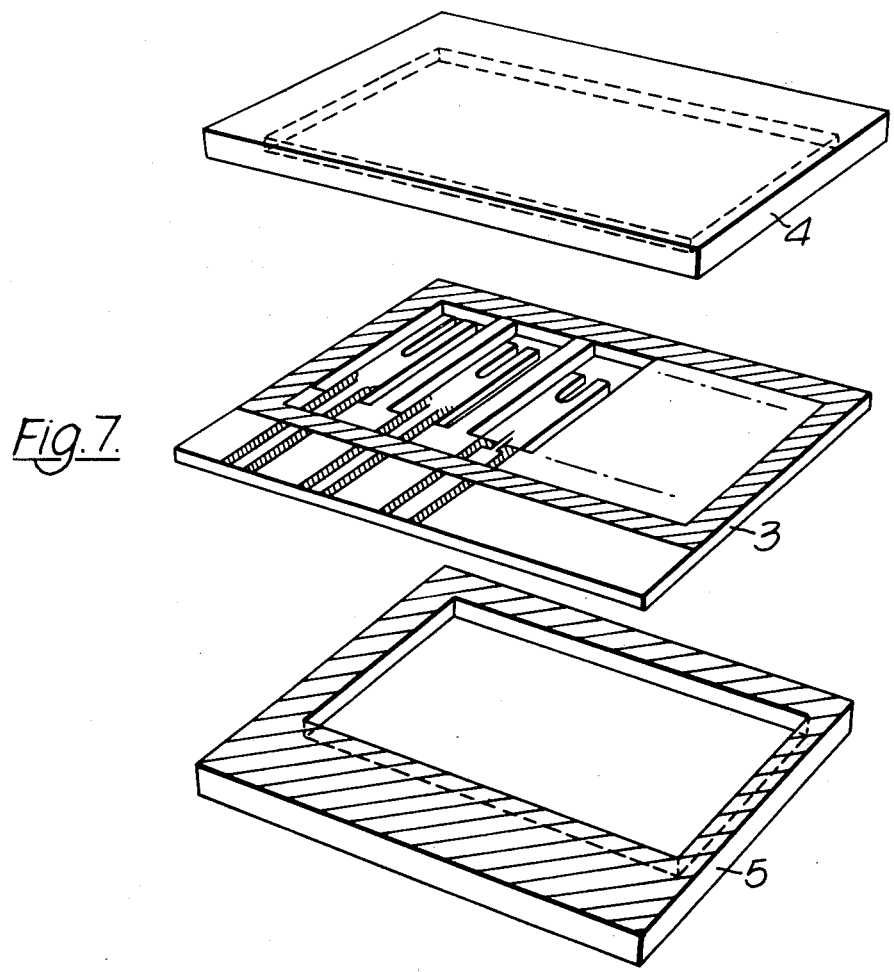
FIGS. 7 and 8 illustrate the case of a number of resonators used as a multichannel filter.
Figure 8:
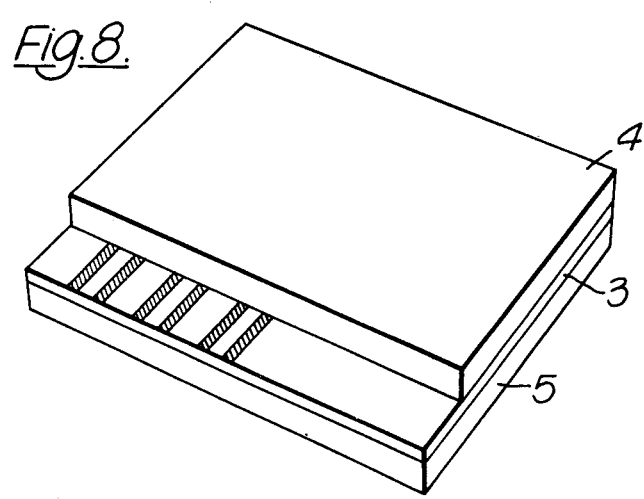

The case of components having two resonators may equally be generallised without difficulty to any desired number of resonators disposed side by side as shown in FIGS. 7 and 8. In this case however for the realisation of the external connections (internal cross connections may be easily obtained by well known processes of insulation by evaporation of $SiO_2$ "sputtering" of $SiO_2$, $Al_2O_3$, or $TA_2O_5$, or again deposition in gaseous phase of appropriate compositions on layer 3), the upper terminal layer 4 will be slightly less wide than the two other layers 3 and 5 in a fashion to free the extremities of the metallized tracks of layer 3, this being equivalent to notches 8 of the preceding cases. A finished product may then have the aspect as shown in FIG. 8. Such a component may be utilised as a multichannel filter.

Figure 9:
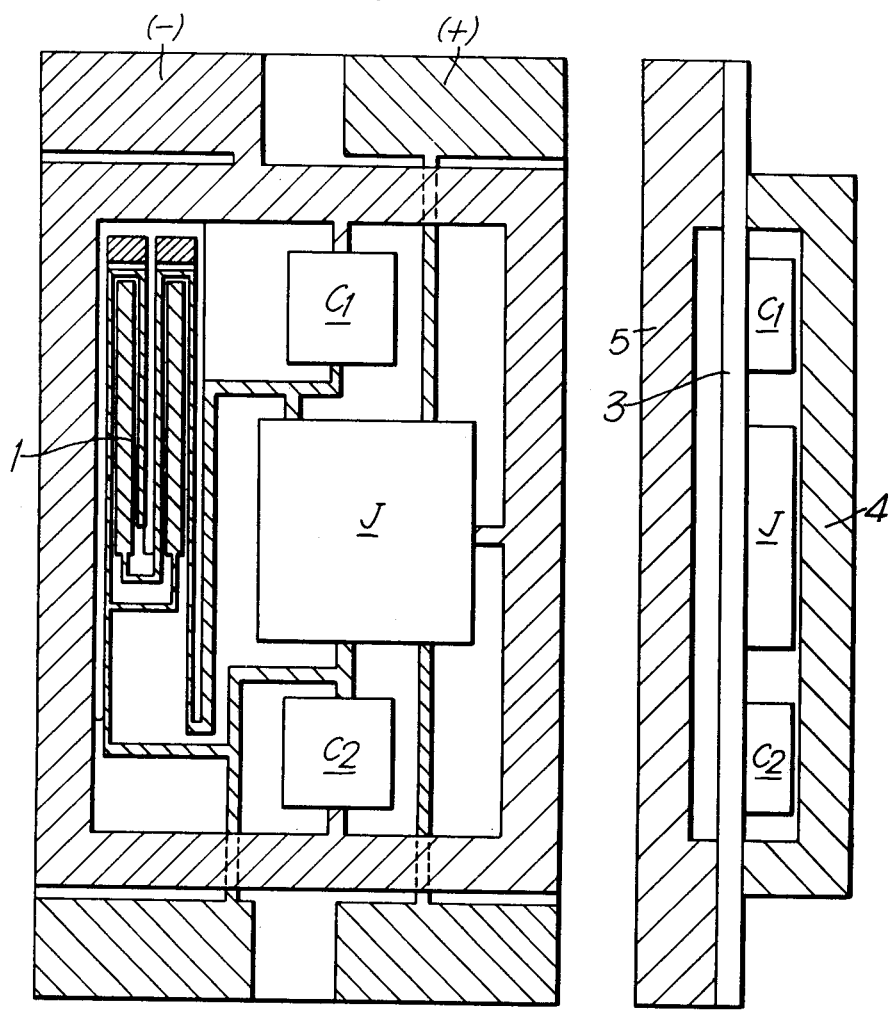
FIG. 9 represents a component according to the invention comprising a resonator as well as further discrete electronic components.

On FIG. 9 is shown in plan the layer 3 concerning another type of component in accordance with the invention. This comprises at least one resonator 1 but on the surface of layer 3 which remains free are attached, according to any appropriate method, other individual discrete components, as for instance an integrated circuit J and condensers C1 and C2. The layer 3 is thus employed as a substrate provided with electrical conductors formed as a thin film with their areas of connection.

It is evident that the process of mass manufacture described previously in a connection with isolated resonators is equally applicable without major changes to the other examples which have just been described and illustrated by FIGS. 5 to 9.

In all that has previously been described, it is to be noted that by the utilisation of the same layer 3 of piezoelectric material, for instance monocristallyne quartz, the monolithic resonators thus obtained and enclosed in the same final electronic component are necessarily of the same cut, for instance the cut X,Z,AT, etc., as the layer 3 itself. The same technique can, without particular technological difficulties, be generalised to components which may include resonators having different cuts. For this one may employ several piezoelectric layers cut as desired and superposed in a manner to be insulated from one another by intermediate layers, the stack being completed on either hand by a terminal layer. Thus with n (n an integer $\geq 1$) piezoelectric layers in each of which is blanked at least one resonant element, one may have in the same final component m monolithic resonators ($m \geq n \geq 1$), the piezoelectric layers being separated by $n-1$ intermediate insulating layers, and the entire assembly being enclosed between two terminal insulating layers.

Figure 10:
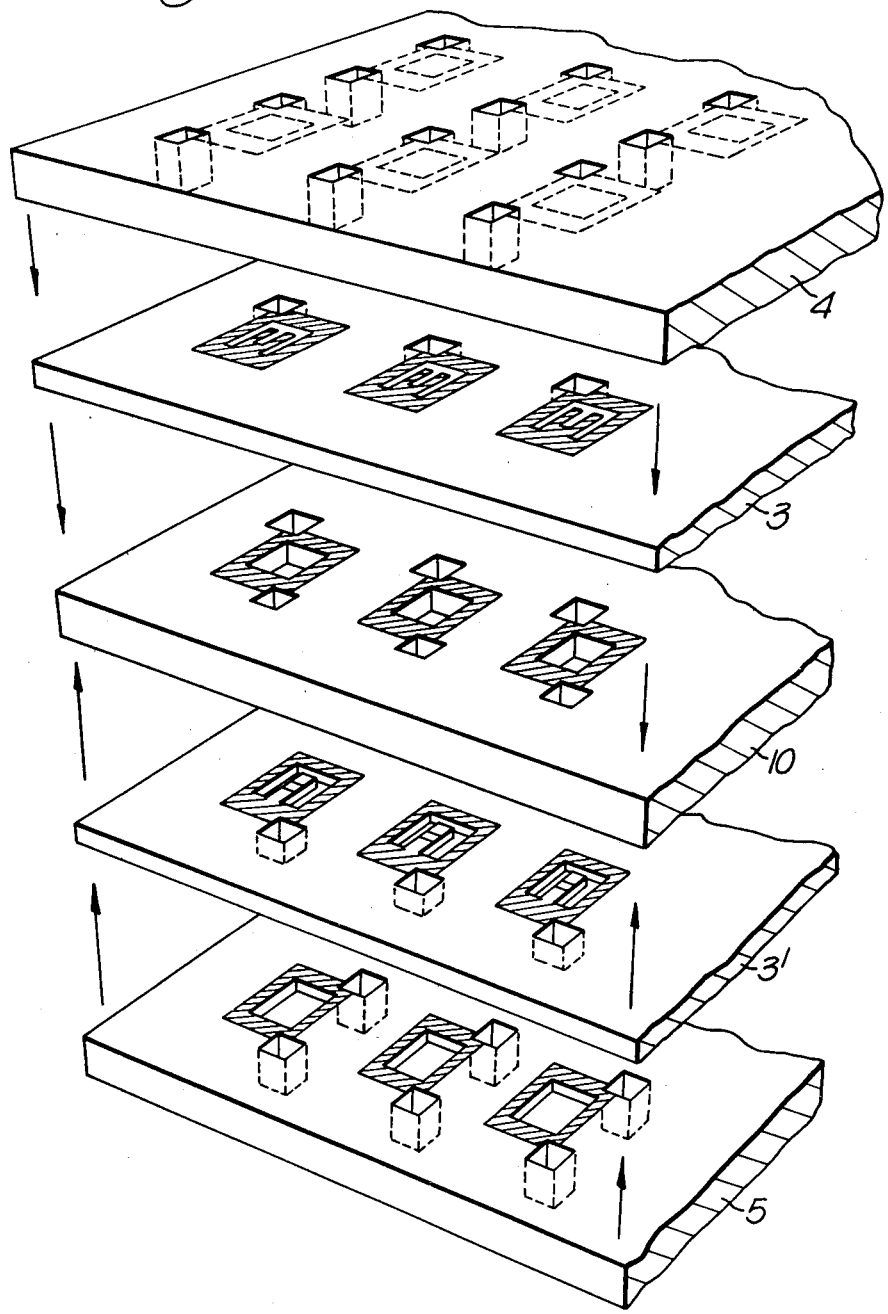
FIG. 10 illustrates a process for obtaining components comprising two superposed resonators of different types.
Figure 11:
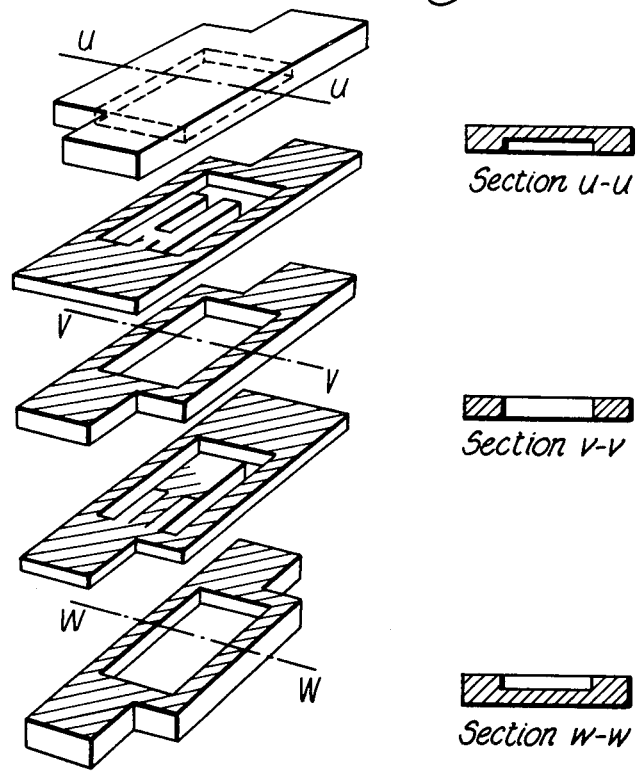
Figure 12:
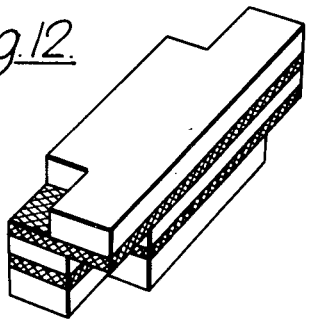
FIGS. 12 and 13 show the finished component before and after fixing of the connecting wires.
Figure 13:
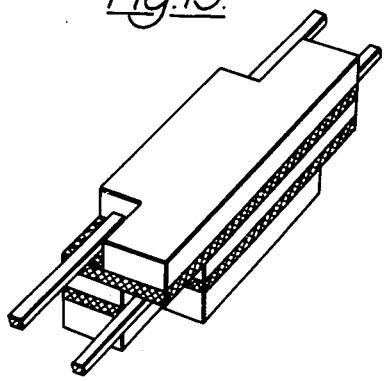

FIG. 10 illustrates such an assembly having five layers obtained by the mass production process already described in connection with the simple resonators. An individual component appears in an exploded view in FIG. 11, and, following sawing apart of the assembled stack of layers, it appears as shown in FIG. 12. FIG. 13 represents the finished product following attachment of the connecting wires. In the example shown, in order to clear an access area above and below to a metallized area on each piezoelectric layer 3, 3' thereby to electrically excite the resonators and subsequently for definite fixing of the conductor wires (FIG. 13) the intermediate layer 10 and terminal layers 4,5 each bear two perforations on the edge of their frames, for example as shown at the extremities of a diagonal for the intermediate layer 10 and at the extremities of a principal edge which is not the same in both cases for the terminal layers 4 and 5. The piezoelectric layers each bear a single perforation in a corner of the frame, the perforation of one being in the opposite corner to that of the other. Each of the piezoelectric layers is thus accessible from above and below.

Assembly and adjustment of the frequency do not pose any particular problem beyond that described for the simple case. The utilisation of components thus obtained is of interest in thermal compensation techniques.

The technology of the multilayer conception of the component in accordance with the invention enables, beyond what has already been described, the application of a process for the application of material for final adjustment of the frequency as an alternative to the process by which material is removed. An example of such an application is shown in FIGS. 14 and 15 for an individual component this being evidently valid for mass production. As previously, the piezoelectric layer with its resonant element is placed between two terminal layers 4 and 5. The latter are optically transparent and their cavities are coated with a film 11, 11' of evaporable metal having a high vapour pressure. Between the two terminal layers 4 and 5 and the piezoelectric layer 3 are interposed insulating layers 12 and 12' each provided with a blind cavity 13 on the side facing the resonant element in order to provide clearance for the latter, and a frame of the metallic alloy, as in the previous case, on both surfaces. In these cavities are provided calibrated openings 14 facing at least one portion of the active zone of the resonant element. Such openings 14 thus provide communication between the housing of the resonant element and the cavities of the terminal layers 4 and 5.

The component is assembled as in the preceding cases and its coarse frequency adjustment is obtained according to the process already described. A final frequency adjustment is effected thereafter by submitting one or the other of the covers which comprise the terminal layers 4 and 5 to a heat ray represented schematically at 15 in FIG. 15. This ray causes melting and evaporation of the charges 11, 11' of evaporable metal within the terminal layers 4 and 5. The vapour, for which the pressure is elevated, thereafter is deposited via openings 14, which play the role of diaphragms, onto the active zones of the resonant element. The procedure of evaporation-deposition is evidently controlled in accordance with the measurement of the frequency according to an appropriate control technology.

As has been shown there are a certain number of advantages which the technology of monolithic resonators and the multilayer conception thereof may bring about, notably the effecting of mass production processes. The described examples concern certain specific applications but it is evident that many other combinations are possible without departing from the basis of the invention through varying the number of resonant elements per layer and per component, employing different cuts of the piezoelectric material and by use of basic electronic components which may be associated with the resonant elements.

What we claim is:

1. A manufacturing process for electric components each of which include at least one piezoelectric resonant element wherein
    n layers of piezoelectric material are blanked so as to form on each layer m resonant elements and surrounding zones which constitute frame supports for said elements to which said elements remain attached (where m and n are integers and $m > n \geq 1$);
    electrodes are deposited on the resonant elements and metallized tracks electrically coupled to the electrodes on each surface of the surrounding zones, said tracks being of a metal or alloy of low melting point;
    $n-1$ intermediate layers are formed from piezoelectric material so as to have openings surrounded by frames of the same dimensions as the frame supports to place said frames in registry with said frame supports;
    metal tracks are deposited on each surface of said intermediate layers;

two terminal layers are formed from piezoelectric material so as to have on inner surfaces thereof blind cavities and frame surfaces of the same dimensions as the frame supports to place said frames in registry with said frame supports;

metal tracks are deposited on the frame surfaces of the terminal layers;

openings are provided in at least said terminal-layer frames permitting access from the exterior to the metallized tracks on said frame supports;

the several layers are assembled under vacuum or partial vacuum in the presence of a noble or inert gas by bringing them into contact after correct positioning thereof with the two terminal layers sandwiching said layers of piezoelectric material separated by said intermediate layers therebetween;

the assembly is brought to a temperature above the melting point of the metal or alloy and then cooled until solidification of said metal or alloy;

only thereafter cutting through the layers between resonant elements for separating the assembled layers into various individual components each component being composed of portions of the assembled layer; and the connection wires are then attached.

2. A manufacturing process as set forth in claim 1 wherein, the edges of all frames and frame supports are provided with openings and each component has at least n resonant elements therein.

3. A manufacturing process as set forth forth in claim 1 wherein two resonant elements are formed onto one layer of piezoelectric material in order to obtain after separation two electronic components which include only one resonant element each.

4. A manufacturing process as set forth in claim 1 wherein four resonant elements are formed onto one layer having the same frequency but alternatively being of different dimensions in order to obtain after separation two electronic components which include two resonant elements so that their respective inversion temperatures are staggered thereby to enable thermocompensation.

5. A manufacturing process as set forth in claim 1 wherein four resonant elements are formed onto two layers of piezoelectric material having different cuts in order to obtain after separation two electronic components which include two resonant elements.

* * * * *